United States Patent
Yu

(10) Patent No.: US 11,409,026 B2
(45) Date of Patent: Aug. 9, 2022

(54) MIRROR CABINET CAPABLE OF PREVENTING MIRROR CAPACITIVE TOUCH BUTTON FROM TOUCH MISSOPERATION

(71) Applicants: Self Electronics Co., Ltd., Zhejiang (CN); Wanjiong Lin, Zhejiang (CN); Self Electronics USA Corporation, Norcross, GA (US)

(72) Inventor: Jianfeng Yu, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 0 days.

(21) Appl. No.: 17/301,194

(22) Filed: Mar. 29, 2021

(65) Prior Publication Data

US 2021/0302629 A1  Sep. 30, 2021

(30) Foreign Application Priority Data

Mar. 31, 2020  (CN) .......................... 202010245061.X

(51) Int. Cl.
| | |
|---|---|
| *G02B 5/08* | (2006.01) |
| *A47B 67/00* | (2006.01) |
| *A47G 1/02* | (2006.01) |
| *G06F 3/041* | (2006.01) |
| *G06F 3/044* | (2006.01) |
| *H03K 17/96* | (2006.01) |

(52) U.S. Cl.
CPC .......... *G02B 5/0808* (2013.01); *A47B 67/005* (2013.01); *A47G 1/02* (2013.01); *G06F 3/044* (2013.01); *G06F 3/0418* (2013.01); *H03K 17/962* (2013.01); *H03K 2217/9607* (2013.01)

(58) Field of Classification Search
CPC ...... G02B 5/0808; A47B 67/005; A47G 1/02; G06F 3/0418; G06F 3/044; H03K 17/962; H03K 2217/9607
See application file for complete search history.

(56) References Cited

U.S. PATENT DOCUMENTS

| | | | | |
|---|---|---|---|---|
| 2017/0285382 | A1* | 10/2017 | Hasegawa | G06F 3/045 |
| 2018/0032227 | A1* | 2/2018 | Broxson | G06F 3/0421 |
| 2018/0245786 | A1* | 8/2018 | Fujiwara | A61N 5/0618 |
| 2019/0087788 | A1* | 3/2019 | Murphy | E03D 5/105 |

(Continued)

FOREIGN PATENT DOCUMENTS

| | | | | |
|---|---|---|---|---|
| EP | 3064094 A1 * | 9/2016 | ............. | A45D 42/10 |
| EP | 3375331 A1 * | 9/2018 | ............. | A45D 42/10 |

*Primary Examiner* — Michael Pervan
(74) *Attorney, Agent, or Firm* — Wang Law Firm, Inc.

(57) ABSTRACT

The invention relates to a mirror cabinet capable of preventing mirror capacitive touch button from touch misoperation, the mirror cabinet comprises a mirror surface, which comprises a glass layer, a metal plating layer provided on the back of the glass layer, and an uncoated metal layer area is provided on the back of the glass layer, and a capacitive touch panel including a plurality of touch buttons is provided in the uncoated metal layer area; a back of the mirror is also provided with a controller electrically connected to the capacitive touch panel and a high-frequency switching power supply electrically connected to the controller. The mirror cabinet can prevent touch misoperation of the mirror surface capacitive touch button so as to enable a touch system to have good stability.

6 Claims, 6 Drawing Sheets

(56) References Cited

U.S. PATENT DOCUMENTS

| | | | |
|---|---|---|---|
| 2019/0089550 A1* | 3/2019 | Rexach | H04L 12/282 |
| 2019/0133345 A1* | 5/2019 | Franz | A47G 1/02 |
| 2019/0191850 A1* | 6/2019 | Yoganandan | G06F 3/0304 |
| 2019/0291647 A1* | 9/2019 | Yang | G06F 3/167 |
| 2019/0373152 A1* | 12/2019 | Tan | H04N 5/2257 |
| 2020/0029689 A1* | 1/2020 | Yao | F21V 23/0485 |
| 2020/0348896 A1* | 11/2020 | Liu | H05K 5/0217 |
| 2021/0041758 A1* | 2/2021 | Rosenblum | A47G 1/02 |
| 2021/0203520 A1* | 7/2021 | Rexach | A47K 13/305 |
| 2021/0232254 A1* | 7/2021 | Tu | G06F 3/0416 |

* cited by examiner

MIRROR CABINET CAPABLE OF PREVENTING MIRROR CAPACITIVE TOUCH BUTTON FROM TOUCH MISSOPERATION

RELATED APPLICATION

This application claims priority to a Chinese Patent Application No. CN 202010245061.X, filed on Mar. 31, 2020.

FIELD OF THE TECHNOLOGY

The present invention relates to the technical field of household appliances, in particular to a mirror cabinet which can prevent the misoperation of a mirror capacitive touch button.

BACKGROUND OF THE INVENTION

With the continuous improvement of people's living standards, people's requirements for household products are getting higher and higher. In order to meet the needs of consumers, mirror cabinets on the market are usually equipped with LED lights, and in order to make mirror cabinets more beautiful, the control buttons used to control the switch, brightness, hue, etc. of the LED lamp are arranged on the mirror surface of the mirror cabinet. These control buttons generally adopt capacitive touch buttons.

However, this capacitive touch button may have some problems during use. The mirror surface of the existing mirror cabinet includes glass layer, metal coating layer, etc. from the front to the back. There is a non-metal coating area on the back of the glass layer to install a touch panel including multiple touch buttons. The back of the mirror is also provided with a high-frequency switching power supply and a controller that controls the LED lights. The high-frequency transformer in the high-frequency switching power supply will generate a high-frequency radiation signal during operation, which will form a coupling capacitor $C4$ between the metal coating layer and the touch panel, such as shown in FIG. 4, this will cause the touch point of the touch panel to have a charge change, which will cause a misoperation during the touch operation. For example, originally it needs to adjust the brightness of the LED lamp by touching the brightness button, but the color of the LED lamp changes, resulting in that the stability of the entire touch system is affected.

BRIEF SUMMARY OF THE INVENTION

In view of the above problems, the object of the present invention is to provide a mirror cabinet that can prevent the misoperation of the mirror capacitive touch button to improve the stability of the touch system.

In order to achieve the above objective, the technical solution of the present invention is: a mirror cabinet which is capable of preventing mirror capacitive touch button from touch misoperation comprises a mirror surface, the mirror surface comprising a glass layer, a metal plating layer provided on the back of the glass layer, and an uncoated metal layer area is provided on the back of the glass layer, and a capacitive touch panel including a plurality of touch buttons is provided in the uncoated metal layer area;

a back of the mirror is also provided with a controller electrically connected to the capacitive touch panel and a high-frequency switching power supply electrically connected to the controller;

characterized in that:

it also includes a metal component arranged on the mirror surface and insulated from the metal plating layer, and the metal component is electrically connected to the ground terminal of the controller;

the capacitance value of the second capacitor $C5$ formed between the metal component and the metal plating layer is at least 10 times the capacitance value of the first capacitor $C4$ formed between the metal plating layer and the capacitive touch panel.

a safety capacitor $Y1$ is connected to the ground terminal of the controller, and the metal component is connected to the ground terminal through the safety capacitor $Y1$;

the capacitance of the safety capacitor $Y1$ is at least 10 times the capacitance of the second capacitor $C5$.

the mirror surface also includes an insulating coating arranged on the back of the metal plating layer, and an uncoated insulating coating area is also provided on the back of the glass layer, and the uncoated insulating coating area corresponds to the position of the uncoated metal plating layer.

the metal component is a metal adhesive tape arranged on the back of the insulating coating, and the metal adhesive tape is connected to the safety capacitor $Y1$ through a wire.

the metal component is a metal frame arranged on the periphery of the mirror surface.

the material of the metal plating layer is mercury.

Compared with the prior art, the advantages of the present invention are:

By setting the metal component to connect to the ground terminal of the controller, the capacitance of the second capacitor $C5$ formed between the metal component and the metal plating layer of the mirror is much larger than the capacitance of the first capacitor $C4$ formed between the metal plating layer and the touch panel, thus making the high-frequency interference signal of the power supply flow through the capacitor $C4$ formed by the coupling between the capacitive touch panel and the metal plating layer with little charge, thereby greatly reducing the influence of high-frequency radiation interference signals on the capacitive touch panel, thus the potential moving point of the capacitive touch panel due to the presence of interference signals is converted into a potential static point, which prevents the touch false action of the capacitive touch panel and improves the stability of the mirror touch system.

DETAILED DESCRIPTION OF THE INVENTION

Figure 1:
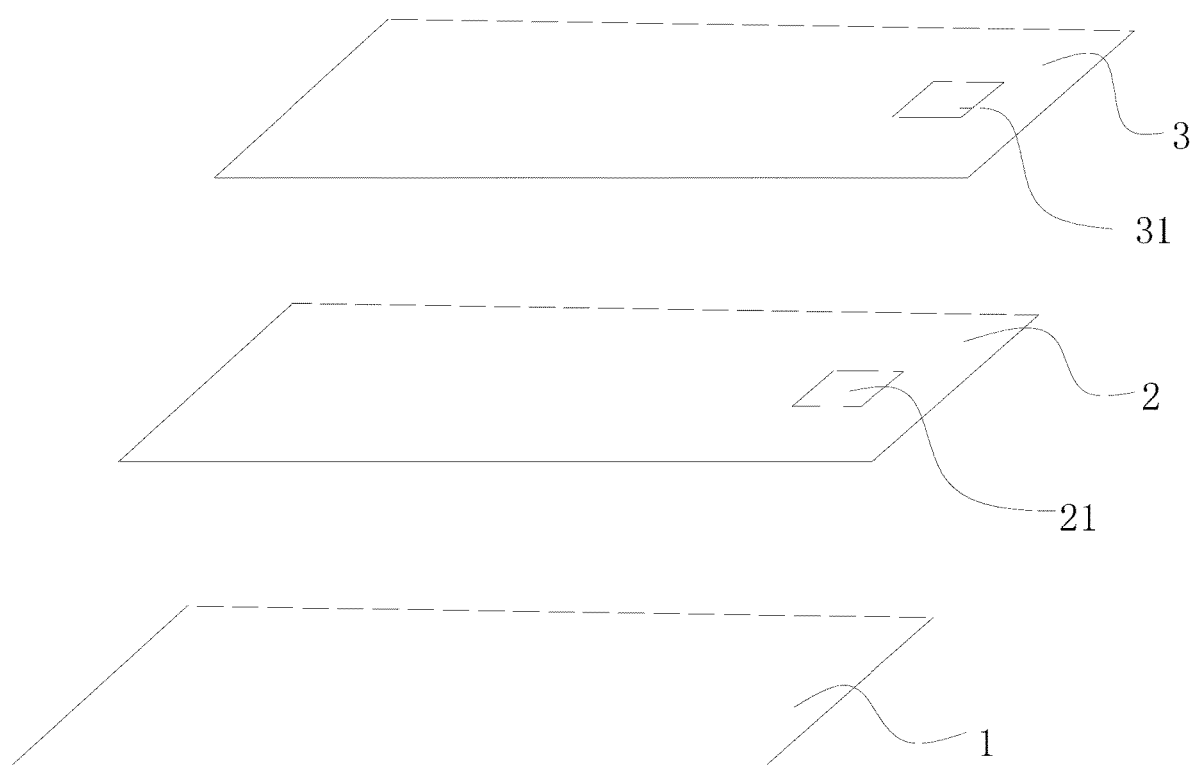
FIG. 1 shows a schematic diagram of the mirror layered structure of this application.

The embodiments of the present invention are described in detail below. Examples of the embodiments are shown in the accompanying drawings, in which the same or similar reference numerals indicate the same or similar elements or elements with the same or similar functions. The embodiments described below with reference to the drawings are exemplary, and are only used to explain the present invention, but should not be understood as limiting the present invention.

Figure 2:
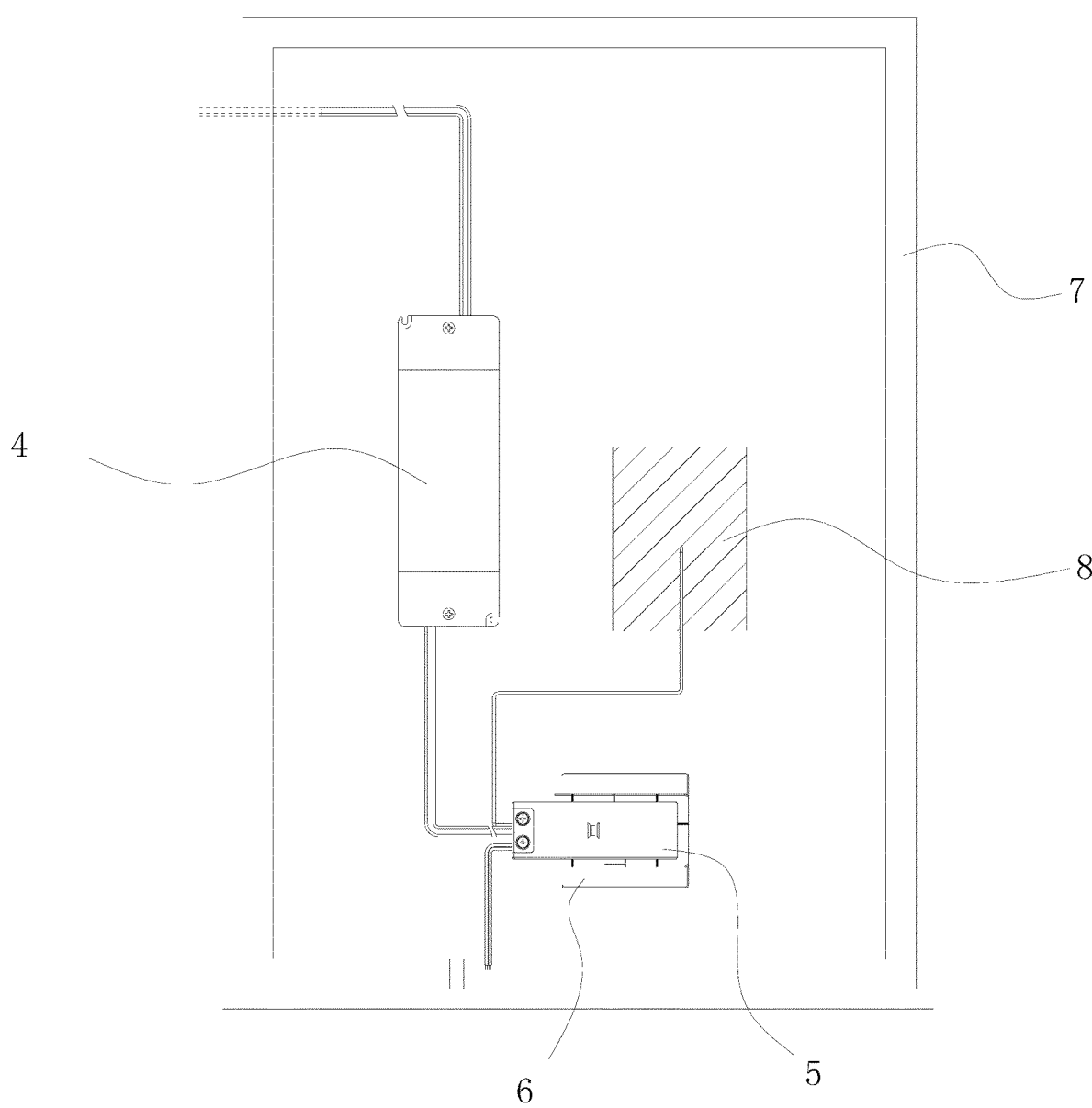
FIG. 2 shows a schematic diagram of the structure of the components on the back of the mirror of this application.

As shown in FIG. 1, it is a schematic diagram of the mirror layered structure of the mirror cabinet, and the FIG. 2 shows a schematic diagram of the structure of the components on the back of the mirror. The mirror surface includes a transparent glass layer 1, a metal plating layer 2 arranged on the back of the glass layer 1 for reflecting light, and the metal plating layer 2 is usually made of mercury. Of course, in order to insulate and protect the metal plating layer 2, an insulating coating 3 is also provided on the metal plating layer 2. The insulating coating 3 can be formed by coating with insulating paint. The back of the mirror is also provided with a high-frequency switching power supply 4 and a controller 5 which is electrically connected to the high-frequency switching power supply 4 and a capacitive touch panel 6 which is electrically connected to the controller 5. The capacitive touch panel 6 is provided with touch buttons used for switching, brightness adjustment, and color adjustment. The mirror cabinet is also provided with LED lamp 7 and the LED lamps 7 are connected to the controller 5.

In this application, the LED lamps 7 are arranged around the mirror surface. Obviously, the LED lamps 7 can also be arranged in other positions as long as the lighting requirements of the user are met. In order to facilitate the installation of the capacitive touch panel 6, the glass layer 1 has an uncoated metal layer area on the back surface. At the same time, the glass layer 1 also has an uncoated insulating coating area on the back surface. The location of the uncoated insulating coating area corresponds to uncoated metal layer area. Corresponding to the layered structure design, you can see in FIG. 1, in fact, it is equivalent to that the metal plating layer 2 is provided with a mounting opening 21 for mounting the capacitive touch panel 6 and the insulating coating 3 is provided with an opening 31 for mounting the capacitive touch panel 6.

Figure 3:
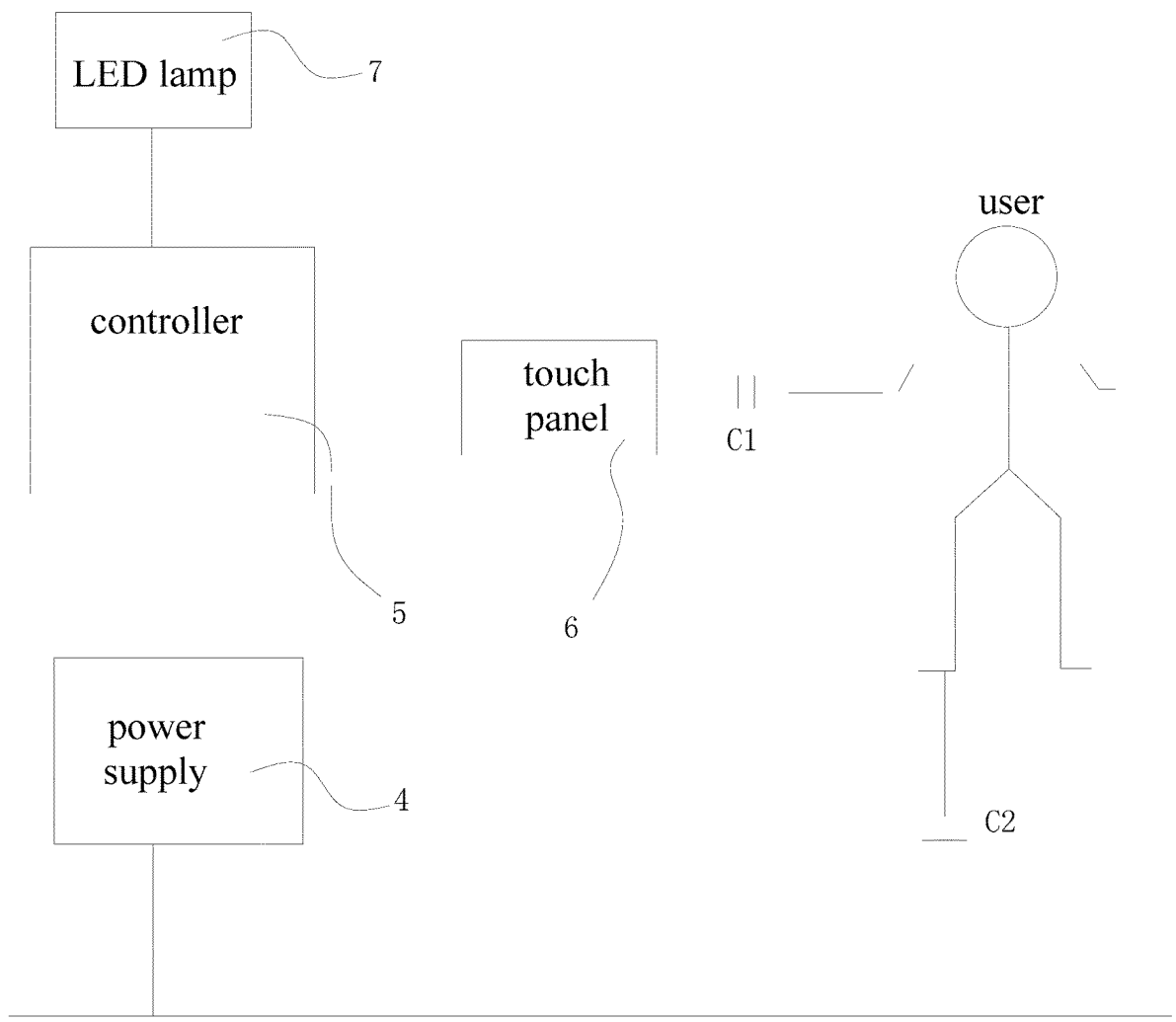
FIG. 3 shows a structural block diagram of the mirror touch button of this application under ideal working conditions.

The FIG. 3 shows an ideal working state diagram of the touch button of the mirror cabinet. As shown in the figure, when the user is operating, a coupling capacitor C1 is formed between the touch finger and the capacitive touch panel 6, and its capacitance is about 1 pF. A coupling capacitor C2 is formed between the ground and the user, and its capacitance is about 100 pF. Through the cooperation of capacitors C1 and C2, charge changes occur at the corresponding touch button on the capacitive touch panel 6, thereby achieving corresponding operation feedback, such as the opening and closing of LED lamp 7 or the adjustment of chroma or brightness.

Figure 4:
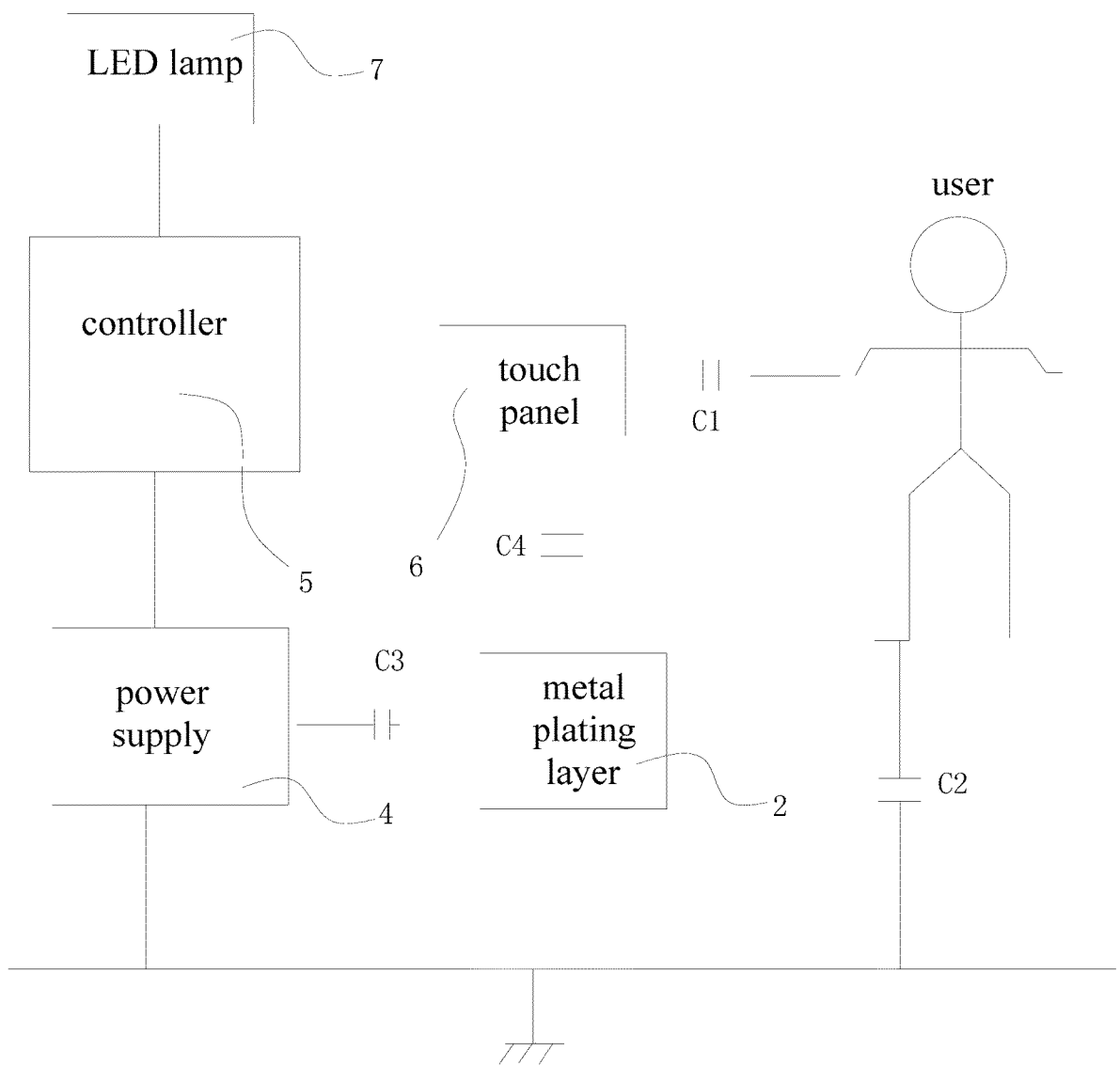
FIG. 4 shows a structural block diagram of the mirror touch button of this application under actual working conditions.

However, the actual situation is that, in addition to the presence of capacitors C1 and C2 in actual operation, since the high-frequency transformer in the high-frequency switching power supply 4 will generate high-frequency radiation signals, and the high-frequency radiation signals will cause that the third capacitor C3 is generated by coupling between the high-frequency switching power supply 4 and the metal plating layer (the value of C3 is usually PF level), and the first capacitor C4 is generated by coupling between the metal plating layer 2 and the capacitive touch panel 6 (the value of C4 is usually PF level), As shown in FIG. 4, due to the existence of capacitors C3, C4 and the high-frequency radiation signal in the power supply, the metal plating layer 2 on the mirror belongs to the potential moving point in the entire mirror cabinet system, and a large part of the high-frequency radiation signal is transmitted to the touch point of the capacitive touch panel 6 through the medium of the metal plating layer 2 in a large area of the mirror, causing interference to the touch point and causing false action.

In order to eliminate the potential moving point, the solution adopted by the present application is to provide a metal component 8 insulated from the metal plating layer 2 on the mirror surface. The metal component 8 is electrically connected to the ground terminal of the controller 5, and the capacitance value of the second capacitor C5 formed by coupling between the metal component 8 and the metal plating layer 2 is much larger than the capacitance value of the first capacitor C4 formed between the metal plating layer 2 and the capacitive touch panel 6. Specifically, the capacitance value of the second capacitor C5 is at least 10 times the capacitance value of a capacitor C4. Connecting the metal component 8 to the ground terminal of the controller 5 enables the charge formed by the interference signal to flow to the ground terminal, thereby reducing the charge flowing to the capacitive touch panel and reducing the influence of the interference signal on the touch panel.

In order to ensure the safety of the operation of the touch button, the controller in this embodiment is also provided with a safety capacitor Y1, the metal component 8 is connected to the ground terminal of the controller 5 through the safety capacitor Y1, and the capacitance value of the safety capacitor Y1 is at least 10 times that of C5, so that the capacitance value of safety capacitor Y1 is much larger than that of C5.

Figure 5:
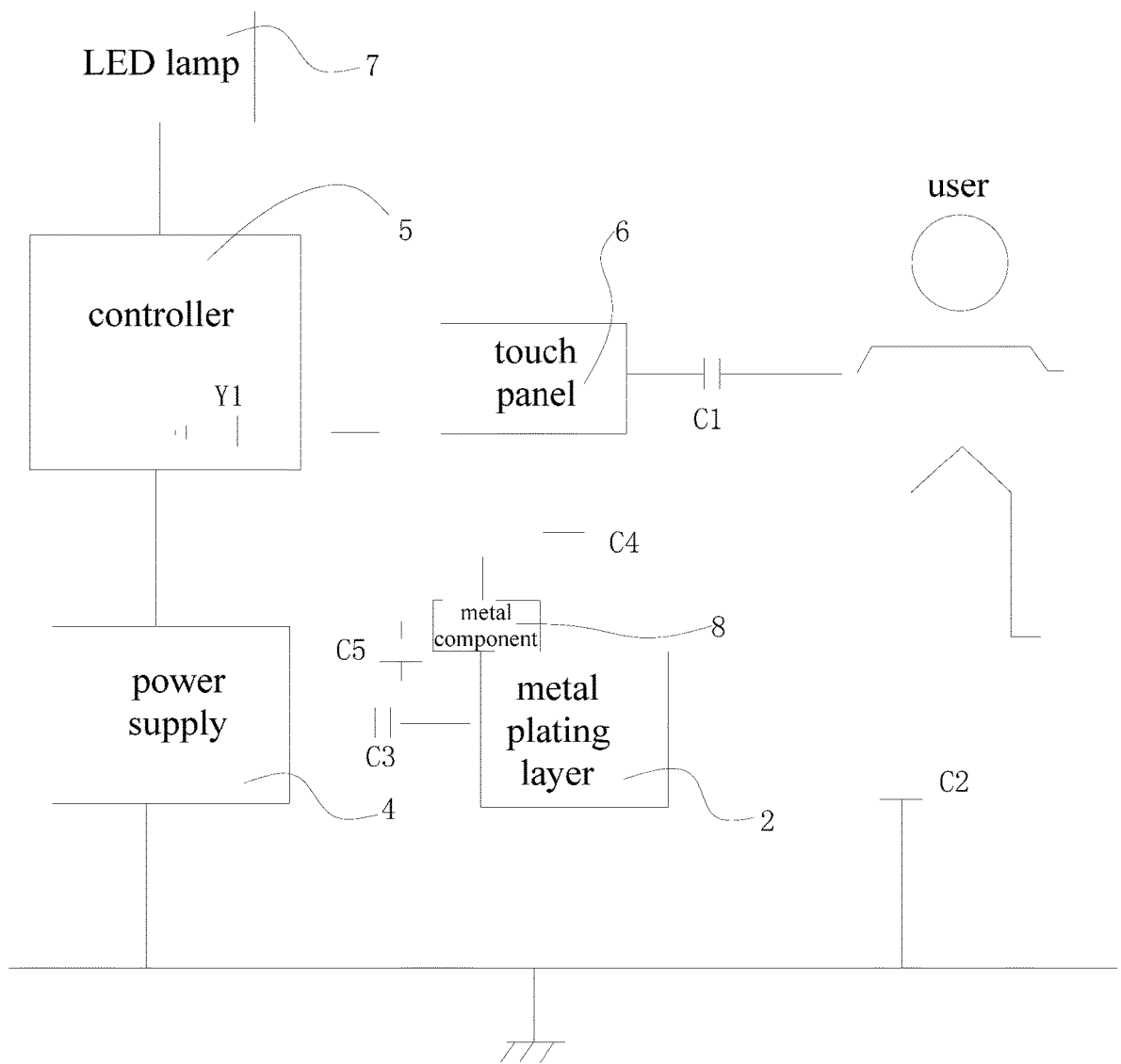
FIG. 5 shows a structural block diagram of the mirror cabinet of this application under actual working conditions after the safety capacitors and metal components are installed.

As a preferred embodiment, the metal component may be a metal adhesive tape 8, which is closely attached to the back of the insulating coating 3 covering the mirror surface and connected to the safety capacitor Y1 through a wire. The FIG. 5 shows the block diagram of the solution. Of course, for some mirrors provided with a metal frame, the metal component can be the metal frame, that is, the safety capacitor Y1 is connected to the metal frame through a wire. As a person skilled in the art, this solution does not make any adjustments to the metal frame structure of the mirror, so it is not shown in the drawings.

Figure 6:
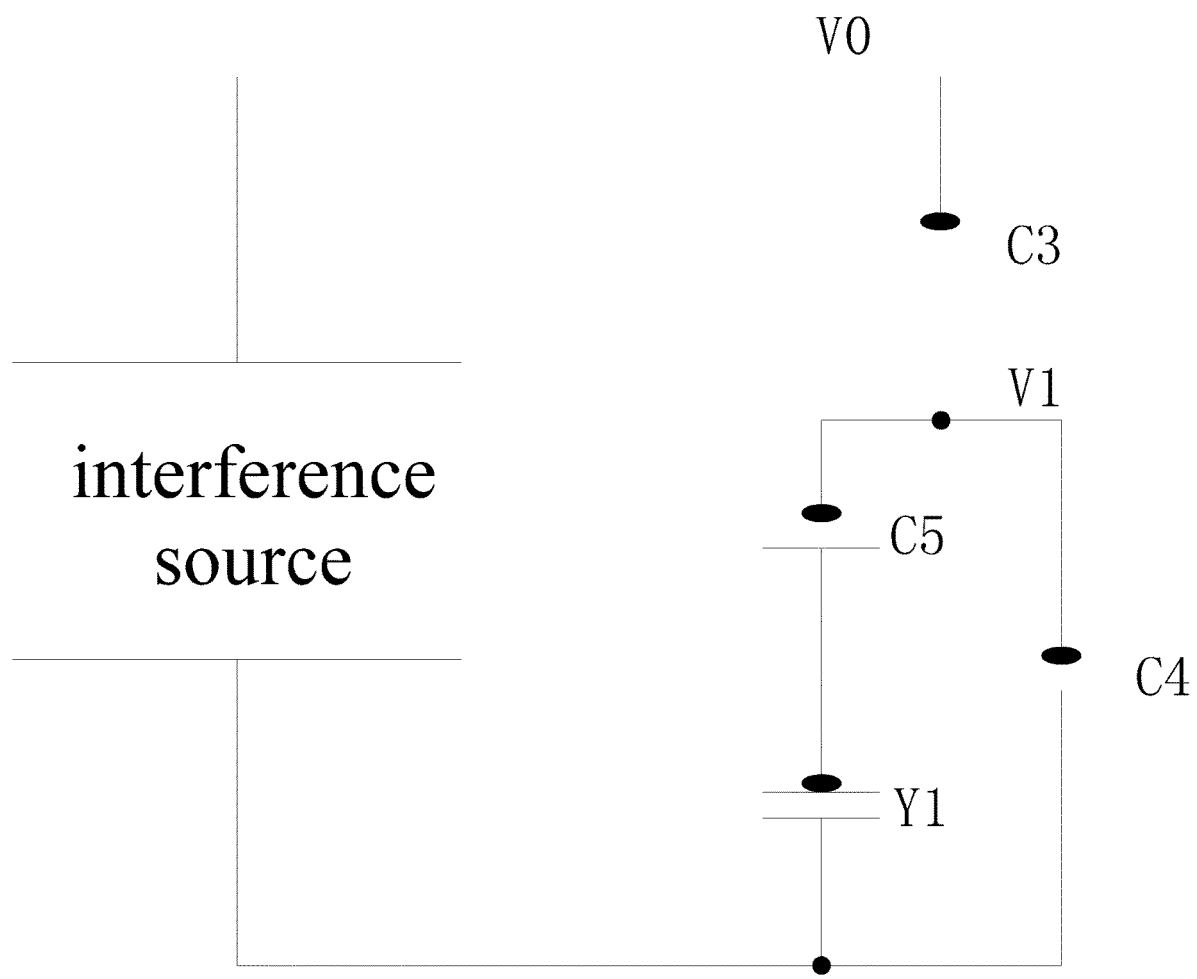
FIG. 6 shows the corresponding equivalent circuit diagram in FIG. 5.

Through the aforementioned structural improvements, it can be obtained the equivalent circuit diagram shown in FIG. 6, the second capacitor C5 and the safety capacitor Y1 are equivalent to connected in series, and C5 is connected in series with Y1 and then connected in parallel with C4. The high-frequency interference signal of the power supply is divided into two paths after passing through the third capacitor C3, and one way is grounded after the first capacitor C4, and the other path is grounded after passing through the second capacitor C5 and the safety capacitor Y1.

Suppose the high-frequency interference signal voltage of the power supply is V0, the interference signal voltage divided by the first capacitor C4 is V1, that is, the interference signal voltage divided by the capacitive touch panel is V1, combined with the capacitive reactance formula Xc=1/ωc, wherein Xc is the capacitive reactance, ω is the angular frequency, and c is the capacitance value. Since the capacitance value of the safety capacitor Y1 is much larger than that of the second capacitor C5, in this case, the capacitive reactance formed by the safety capacitor Y1 can be ignored, in this way, the relationship between V1 and V0 is obtained as follows:

$$V1=(1/(\omega c4+\omega c5))/((1/(\omega c4+\omega c5))+(1/\omega c3)),$$

wherein c3, c4, and c5 are the capacitance values of capacitors C3, C4, and C5 respectively;

After conversion:

$$V1=(c3/(c3+c4+c5))V0$$

And because the capacitance of the second capacitor C5 is much larger than the capacitance of the first capacitor C4, V1 can be approximately calculated as:

$$V1=(c3/(c3+c5))V0$$

It can be seen from this formula that when the capacitance of the safety capacitor Y1 is much greater than the capacitance of the second capacitor C5 and the capacitance of the second capacitor C5 is much greater than the capacitance of the first capacitor C4, the voltage divided by the first capacitor C4 is determined by the capacitance ratio of the second capacitor C5 and the third capacitor C3. It can be seen that through this design, the high-frequency interference signal voltage of the power supply obtained by the touch points on the capacitive touch panel 6 can be borne by C3 and C5. The parasitic capacitance C4 formed by the coupling of the touch panel itself can be ignored, and the value of V1 can be small when the capacitance value of C5 is much larger than the capacitance value of C3, that is, the interference signal voltage obtained by the capacitive touch panel 6 is very small. In this way, the capacitance values of C3 and C5 can be controlled to reduce the influence of interference signals on the touch points of the capacitive touch panel, thereby improving the stability of the touch system.

According to the above and combined with the calculation formula of the capacitance value of the plate capacitor: c=εS/4πkd, wherein c is the dielectric constant, S is the corresponding area of the two pole plates, k is the electrostatic constant, and d is the vertical distance between the two pole plates. During production and assembly, When the area of the metal adhesive tape is larger, the capacitance value of the second capacitor C5 will be larger. Similarly, when the high-frequency switching power supply is assembled, the farther it is from the mirror of the mirror cabinet, the smaller the capacity of the third capacitor C3 will be. In other words, the capacitance values of C3 and C5 can be controlled by adjusting the above parameters during production and assembly, and then the desired effect can be achieved.

Of course, the same conclusion can be drawn through current loop analysis. The analysis is as follows:

Since the capacitance value of Y1 is much larger than that of C5, according to the capacitive reactance formula Xc=1/ωc, the capacitance of Y1 is very small compared to that of C5, so it is ignored in the analysis; and because the capacitance of C5 is much larger than that of C4 Value, the capacitive reactance of the branch where C5 is located is much smaller than the capacitive reactance of the branch where C4 is located, and the charge of the high-frequency interference signal of the power supply passes through C3 and most of the charge passes through C5 to form a loop for circulation, and very little charges flow through C4, so the high-frequency interference signal of the power supply has a very small influence on the touch point, thereby improving the stability of the touch system.

Although the embodiments of the invention have been shown and described, those skilled in the art can understand that a variety of changes, modifications, substitutions and deformations can be made to these embodiments without departing from the principle and purpose of the invention, and the scope of the invention is limited by the claims and their equivalents.

What is claimed is:

1. A mirror cabinet capable of preventing a mirror capacitive touch button from touch misoperation, the mirror cabinet comprising a mirror surface, the mirror surface comprising a glass layer (1), a metal plating layer (2) provided on the back of the glass layer (1), and an uncoated metal layer area is provided on the back of the glass layer (1), and a capacitive touch panel (6) including a plurality of touch buttons is provided in the uncoated metal layer area;

a back of the mirror is also provided with a controller (5) electrically connected to the capacitive touch panel (6) and a high-frequency switching power supply (4) electrically connected to the controller (5);

characterized in that:

the controller (5) also includes a metal component (8) arranged on the mirror surface and insulated from the metal plating layer (2), and the metal component (8) is electrically connected to a ground terminal of the controller (5);

a capacitance value of a second capacitor (C5) formed between the metal component and the metal plating layer (2) is at least 10 times a capacitance value of a first capacitor (C4) formed between the metal plating layer (2) and the capacitive touch panel (6).

2. The mirror cabinet capable of preventing mirror capacitive touch button from touch misoperation as claimed in claim 1, wherein a safety capacitor (Y1) is connected to the ground terminal of the controller (5), and the metal component (8) is connected to the ground terminal through the safety capacitor (Y1);

a capacitance of the safety capacitor (Y1) is at least 10 times the capacitance of the second capacitor (C5).

3. The mirror cabinet capable of preventing mirror capacitive touch button from touch misoperation as claimed in claim 1, wherein the mirror surface also includes an insulating coating (3) arranged on the back of the metal plating layer (2), and an uncoated insulating coating area is also provided on the back of the glass layer (1), and the uncoated insulating coating area corresponds to the position of the uncoated metal plating layer.

4. The mirror cabinet capable of preventing mirror capacitive touch button from touch misoperation as claimed in claim 3, wherein the metal component is a metal adhesive tape (8) arranged on the back of the insulating coating (3), and the metal adhesive tape (8) is connected to the safety capacitor (Y1) through a wire.

5. The mirror cabinet capable of preventing mirror capacitive touch button from touch misoperation as claimed in claim 3, wherein the metal component is a metal frame arranged on a periphery of the mirror surface.

6. The mirror cabinet capable of preventing mirror capacitive touch button from touch misoperation as claimed in claim 1, wherein a material of the metal plating layer (2) is mercury.

* * * * *